(12) United States Patent
JangJian et al.

(10) Patent No.: US 11,404,368 B2
(45) Date of Patent: *Aug. 2, 2022

(54) ETCH STOP LAYER IN INTEGRATED CIRCUITS

(71) Applicant: Taiwan Semiconductor Manufacturing Co., Ltd., Hsinchu (TW)

(72) Inventors: Shiu-Ko JangJian, Tainan (TW); Tsung-Hsuan Hong, Tainan (TW); Chun Che Lin, Tainan (TW); Chih-Nan Wu, Tainan (TW)

(73) Assignee: TAIWAN SEMICONDUCTOR MANUFACTURING COMPANY LTD, Hsin-Chu (TW)

( * ) Notice: Subject to any disclaimer, the term of this patent is extended or adjusted under 35 U.S.C. 154(b) by 68 days.

This patent is subject to a terminal disclaimer.

(21) Appl. No.: 16/933,551

(22) Filed: Jul. 20, 2020

(65) Prior Publication Data

US 2020/0350244 A1 Nov. 5, 2020

Related U.S. Application Data

(60) Continuation of application No. 16/148,076, filed on Oct. 1, 2018, now Pat. No. 10,720,386, which is a (Continued)

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/76807* (2013.01);
(Continued)

(58) Field of Classification Search
None
See application file for complete search history.

(56) References Cited

U.S. PATENT DOCUMENTS 6,072,227 A   6/2000  Yau et al.
6,140,226 A  10/2000  Grill et al.
(Continued)

FOREIGN PATENT DOCUMENTS

CN    1193813 A    9/1998
CN    1646994 A    7/2005
(Continued)

OTHER PUBLICATIONS

Park, "Characteristic of Silicon," http://navercast.naver.com/contents.nhn?rid=44&contents_id=6691, Nov. 2, 2011, 16 pages.

*Primary Examiner* — Khaja Ahmad
(74) *Attorney, Agent, or Firm* — Slater Matsil, LLP

(57) ABSTRACT

An integrated circuit structure includes a dielectric layer and an etch stop layer. The etch stop layer includes a first sub layer including a metal nitride over the first dielectric layer, and a second sub layer overlying or underlying the first sub layer. The second sub layer includes a metal compound comprising an element selected from carbon and oxygen, and is in contact with the first sub layer.

20 Claims, 15 Drawing Sheets

Related U.S. Application Data continuation of application No. 15/244,961, filed on Aug. 23, 2016, now Pat. No. 10,090,242, which is a division of application No. 14/689,929, filed on Apr. 17, 2015, now Pat. No. 9,437,484.

(60) Provisional application No. 62/065,459, filed on Oct. 17, 2014.

(52) U.S. Cl.
CPC .. *H01L 21/76826* (2013.01); *H01L 21/76829* (2013.01); *H01L 21/76832* (2013.01); *H01L 21/76834* (2013.01); *H01L 21/76877* (2013.01); *H01L 23/5329* (2013.01); *H01L 23/53238* (2013.01); *H01L 23/53295* (2013.01); *H01L 21/76849* (2013.01); *H01L 2924/0002* (2013.01)

(56) References Cited

U.S. PATENT DOCUMENTS

| | | | |
|---|---|---|---|
| 6,235,603 B1 | 5/2001 | Melnick et al. | |
| 6,335,283 B1* | 1/2002 | Ngo | H01L 21/76826 257/E21.582 |
| 6,902,440 B2* | 6/2005 | Dougan | H01L 21/76826 257/E21.228 |
| 7,391,115 B2 | 6/2008 | Usami et al. | |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 10,090,242 B2 | 10/2018 | JangJian et al. | |
| 2002/0009873 A1 | 1/2002 | Usami | |
| 2003/0134521 A1* | 7/2003 | Guo | H01L 21/31116 438/792 |
| 2003/0166345 A1* | 9/2003 | Chang | H01L 21/31144 438/717 |
| 2003/0194569 A1 | 10/2003 | Angelopoulos et al. | |
| 2004/0157453 A1 | 8/2004 | Delgadino et al. | |
| 2005/0167839 A1 | 8/2005 | Wetzel et al. | |
| 2006/0027922 A1 | 2/2006 | Lee et al. | |
| 2006/0051681 A1 | 3/2006 | Taylor | |
| 2006/0134906 A1 | 6/2006 | Lu et al. | |
| 2007/0249159 A1 | 10/2007 | Tsai et al. | |
| 2008/0150145 A1* | 6/2008 | King | H01L 21/76832 257/762 |
| 2008/0251928 A1 | 10/2008 | Chang et al. | |
| 2010/0230815 A1 | 9/2010 | Tsao et al. | |
| 2011/0081500 A1 | 4/2011 | Zhao et al. | |
| 2011/0186798 A1* | 8/2011 | Kwon | H01L 45/1691 257/2 |
| 2012/0187420 A1 | 7/2012 | Li et al. | |
| 2014/0001574 A1 | 1/2014 | Chen et al. | |
| 2014/0110755 A1 | 4/2014 | Colinge | |
| 2014/0138673 A1* | 5/2014 | Shieh | H01L 29/78696 257/43 |
| 2014/0151812 A1 | 6/2014 | Liaw | |
| 2014/0199628 A1 | 7/2014 | Edelstein et al. | |
| 2014/0264880 A1 | 9/2014 | Sung et al. | |

FOREIGN PATENT DOCUMENTS

| | | |
|---|---|---|
| CN | 101447472 A | 6/2009 |
| DE | 112011100788 B4 | 5/2014 |
| KR | 20040071631 A | 8/2004 |
| KR | 20040084668 A | 10/2004 |
| KR | 20090115190 A | 11/2009 |
| KR | 20130123286 A | 11/2013 |

\* cited by examiner

ETCH STOP LAYER IN INTEGRATED CIRCUITS

PRIORITY CLAIM AND CROSS-REFERENCE

This application is a continuation of U.S. patent application Ser. No. 16/148,076, entitled "Etch Stop Layer in Integrated Circuits," and filed on Oct. 1, 2018, which is a continuation of U.S. patent application Ser. No. 15/244,961, entitled "Etch Stop Layer in Integrated Circuits," and filed on Aug. 23, 2016, now U.S. Pat. No. 10,090,242 issued Oct. 2, 2018, which is a divisional of U.S. patent application Ser. No. 14/689,929, entitled "Etch Stop Layer in Integrated Circuits," filed on Apr. 17, 2015, now U.S. Pat. No. 9,437,484 issued Sep. 6, 2016, which application claims the benefit of the following provisionally filed U.S. Patent application: Application Ser. No. 62/065,459, filed Oct. 17, 2014, and entitled "Etch Stop Layers and Methods of Making Same," which applications are hereby incorporated herein by reference.

BACKGROUND

In integrated circuit art, a commonly used method for forming interconnect structures, which include metal lines and vias, is known as "damascene." Generally, this method involves forming an opening in a dielectric layer using photo lithography and etching techniques. After the formation, the opening is filled with copper or copper alloys. Excess copper on the surface of the dielectric layer is then removed through a Chemical Mechanical Polish (CMP) process. The remaining copper or copper alloy forms metal vias and/or metal lines.

Damascene processes include dual damascene processes and single damascene processes. In a dual damascene process, trenches and via openings are formed first. The via openings are aligned to conductive features such as metal lines in an underlying layer. The trenches and the via openings are then filled in a same metal filling process to form metal lines and vias, respectively. In a single damascene process, metal lines or vias, but not both, are formed.

To form via openings in a dielectric layer, an etching process is performed to expose the underlying metal lines. To prevent excess over-etch that may damage the underlying metal lines, an etch stop layer may be used. The etching process is first stopped on the etch stop layer, and then a different etching gas/chemical is used to etch-through the etch stop layer, so that the underlying metal lines are exposed. Commonly used etch stop materials include silicon nitride, silicon carbide, silicon carbonitride, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
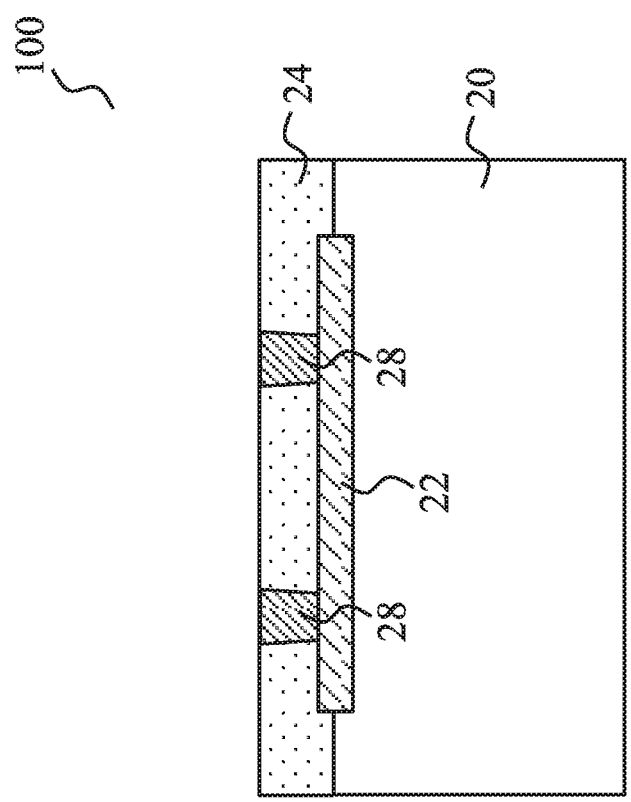
FIGS. 1 through 12 illustrate the cross-sectional views of intermediate stages in the formation of an interconnect structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures of integrated circuits and the methods of forming the same are provided in accordance with various exemplary embodiments. The intermediate stages of forming the interconnect structures are illustrated. The variations of the embodiments are discussed. Throughout the various views and illustrative embodiments, like reference numbers are used to designate like elements.

Figure 15:
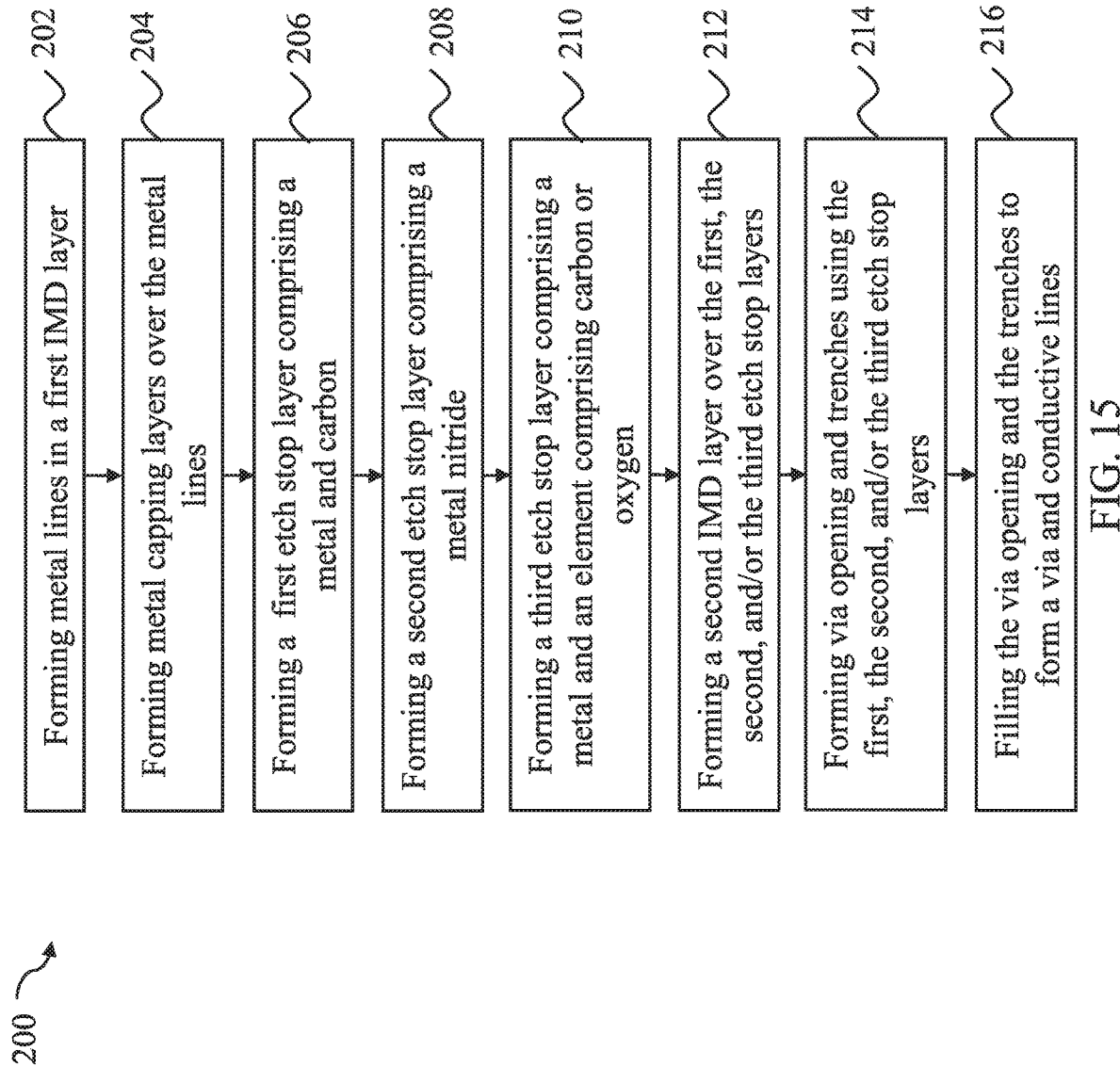
FIG. 15 illustrates a process flow for forming an interconnect structure in accordance with some embodiments.

FIGS. 1 through 12 illustrate the cross-sectional views of intermediate stages in the formation of interconnect structures of integrated circuits in accordance with some embodiments. The steps shown in FIGS. 1 through 12 are also illustrated schematically in process flow 200 as shown in FIG. 15. In the subsequent discussion, the process steps shown in FIGS. 1 through 12 are also discussed referring to the process steps in FIG. 15.

FIG. 1 illustrates wafer 100, which includes semiconductor substrate 20 and the features formed on a top surface of semiconductor substrate 20. In accordance with some embodiments of the present disclosure, semiconductor substrate 20 is formed of a crystalline semiconductor material such as silicon, germanium, silicon germanium, a III-V compound semiconductor such as GaAsP, AlInAs, AlGaAs, GaInAs, GaInP, GaInAsP, and/or the like. Semiconductor substrate 20 may be a bulk silicon substrate or a Silicon-On-Insulator (SOI) substrate.

In accordance with some embodiments of the present disclosure, wafer 100 is used to form a device die. In these embodiments, integrated circuit devices 22 are formed at the top surface of semiconductor substrate 20. Exemplary integrated circuit devices 22 may include Complementary Metal-Oxide Semiconductor (CMOS) transistors, resistors, capacitors, diodes, and the like. The details of integrated circuit devices 22 are not illustrated herein. In alternative embodiments, wafer 100 is used for forming interposers. In these embodiments, no active devices such as transistors and diodes are formed at the surface of substrate 20. There may (or may not) be passive devices such as capacitors, resistors, inductors, or the like formed in wafer 100. Substrate 20 may also be a dielectric substrate in the embodiments in which wafer 100 is an interposer wafer. Furthermore, through-vias (not shown) may be formed to penetrate through substrate 20 in order to interconnect the components on the opposite sides of substrate 20.

Inter-Layer Dielectric (ILD) 24 is formed over semiconductor substrate 20 and fills the space between the gate stacks of transistors (not shown) in integrated circuit devices 22. In some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with alternative embodiments of the present disclosure, ILD 24 is formed using a deposition method such as Plasma Enhanced Chemical Vapor Deposition (PECVD), Low Pressure Chemical Vapor Deposition (LPCVD), or the like.

Contact plugs 28 are formed in ILD 24 and are used to electrically connect to integrated circuit devices 22. For example, contact plugs 28 may include gate contact plugs that are connected to the gate electrodes of transistors (not shown) in integrated circuit devices 22 and source/drain contact plugs that are electrically connected to the source/drain regions of the transistors. In accordance with some embodiments of the present disclosure, contact plugs 28 are formed of a material selected from tungsten, aluminum, copper, titanium, tantalum, titanium nitride, tantalum nitride, alloys therefore, and/or multi-layers thereof. The formation of contact plugs 28 may include etching ILD 24 to form contact openings, filling a conductive material(s) into the contact openings until the conductive material fills the entireties of the contact openings, and performing a planarization (such as Chemical Mechanical Polish (CMP)) to level the top surfaces of contact plugs 28 with the top surface of ILD 24.

Figure 2:
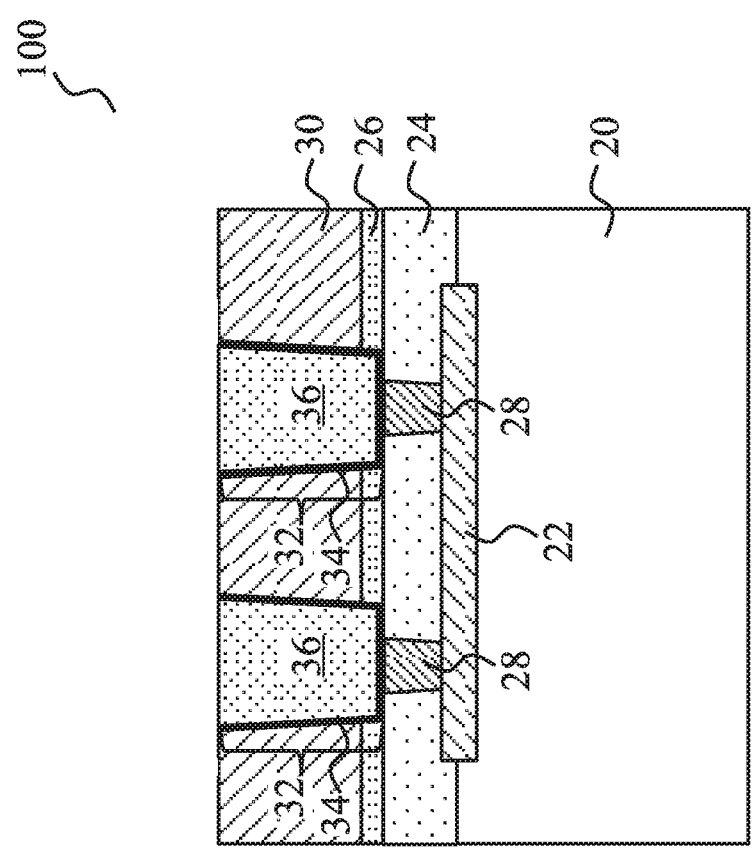
Figure 6:
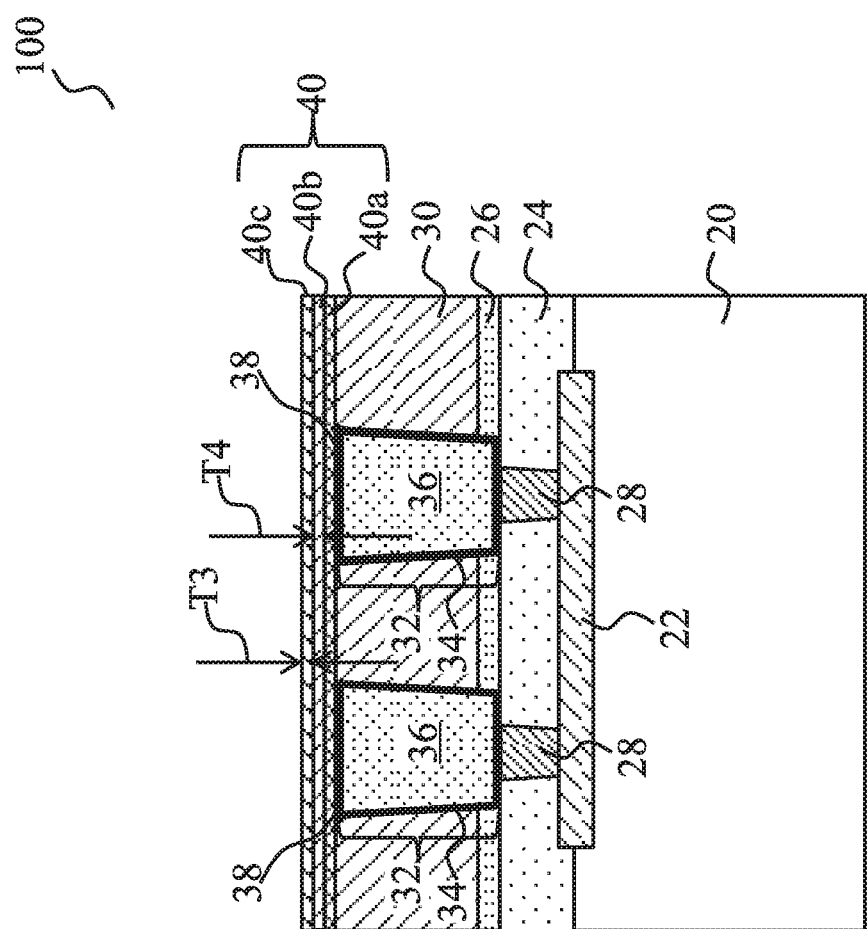
Figure 13:
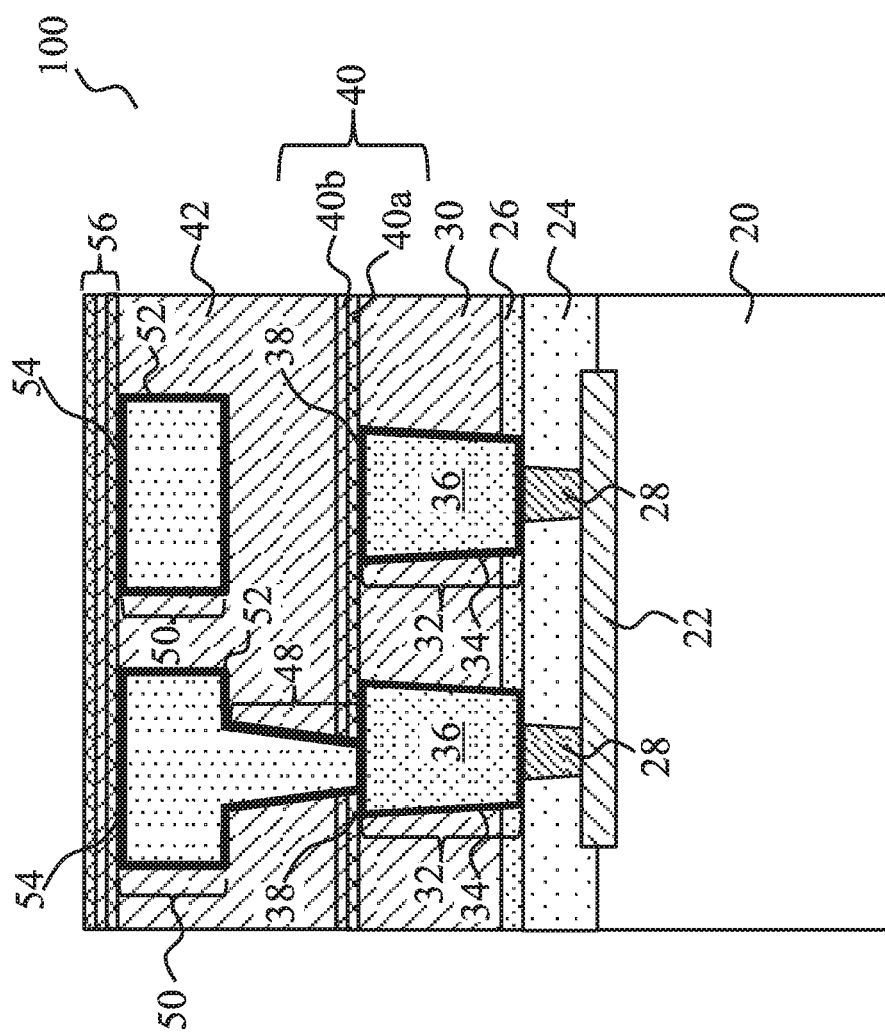
FIG. 13 illustrates a cross-sectional view of an interconnect structure in accordance with some embodiments, wherein a metal carbide layer and an overlying metal nitride layer in combination form an etch stop layer.
Figure 14:
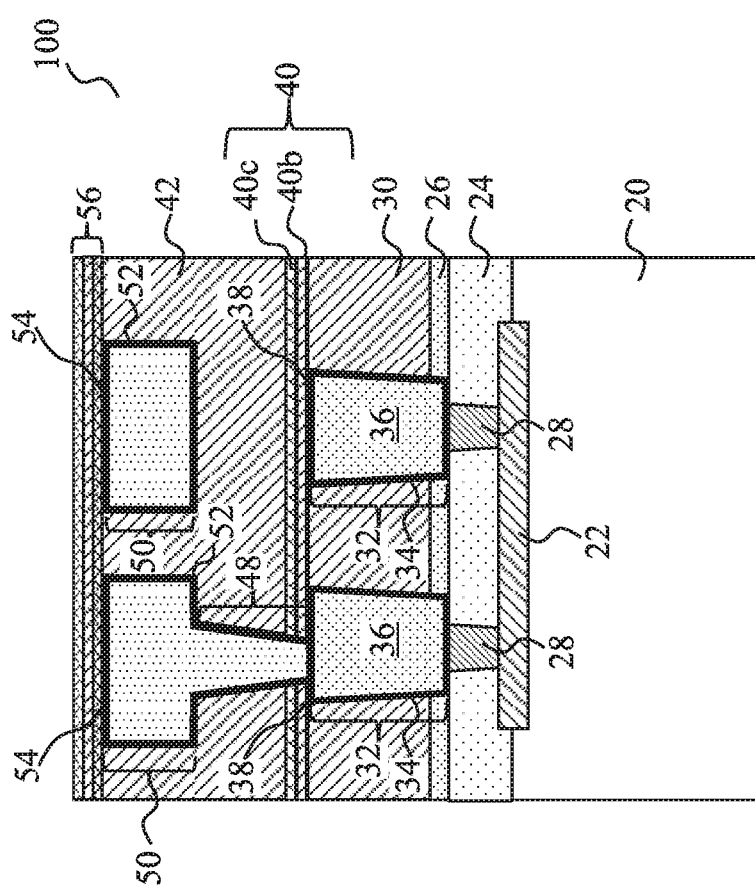
FIG. 14 illustrates a cross-sectional view of an interconnect structure in accordance with some embodiments, wherein a metal nitride layer and an overlying metal carbide layer or metal oxide layer in combination form an etch stop layer.

Referring to FIG. 2, etch stop layer 26 is formed over ILD 24 and integrated circuit devices 22, if any. Etch stop layer 26 may comprise a metal nitride, a metal carbide, a metal oxide, and/or the like, wherein the metal may include aluminum (Al), manganese (Mn), Copper (Cu), or multi-layers thereof. Etch stop layer 26 may also have a structure similar to the structure of the subsequently formed etch stop layer 40 (such as what are shown in FIGS. 6, 13, and 14). In accordance with alternative embodiments, etch stop layer 26 includes silicon carbide, silicon nitride, silicon oxynitride, silicon carbo-nitride, or the like. Etch stop layer 26 is formed of a material that has a high etching selectivity with the overlying dielectric layer 30, and hence etch stop layer 26 may be used to stop the etching of dielectric layer 30.

Further illustrated in FIG. 2 is dielectric layer 30, which is alternatively referred to as Inter-Metal Dielectric (IMD) layer 30 hereinafter. In accordance with some embodiments of the present disclosure, IMD layer 30 is formed of a low-k dielectric material having a dielectric constant (k-value) lower than about 3.0, about 2.5, or even lower. IMD layer 30 may comprise Black Diamond (a registered trademark of Applied Materials), a carbon-containing low-k dielectric material, Hydrogen SilsesQuioxane (HSQ), MethylSilsesQuioxane (MSQ), or the like.

Conductive metal lines 32 are formed in IMD 30. The respective step is also shown as step 202 in process flow 200 shown in FIG. 15. In accordance with some embodiments, metal lines 32 include diffusion barrier layers 34 and copper-containing material 36 over diffusion barrier layers 34. Diffusion barrier layers 34 may include titanium, titanium nitride, tantalum, tantalum nitride, or the like, and have the function of preventing copper in copper-containing material 36 from diffusing into IMD 30. Conductive lines 32 are referred to as metal lines 32 hereinafter. FIG. 2 illustrates that metal lines 32 are in a bottom metal layer, which is the metal layer immediately over contact plugs 28. The illustrated metal lines 32 may also represent metal lines in any metal layer that is over the bottom metal layer.

Figure 3:
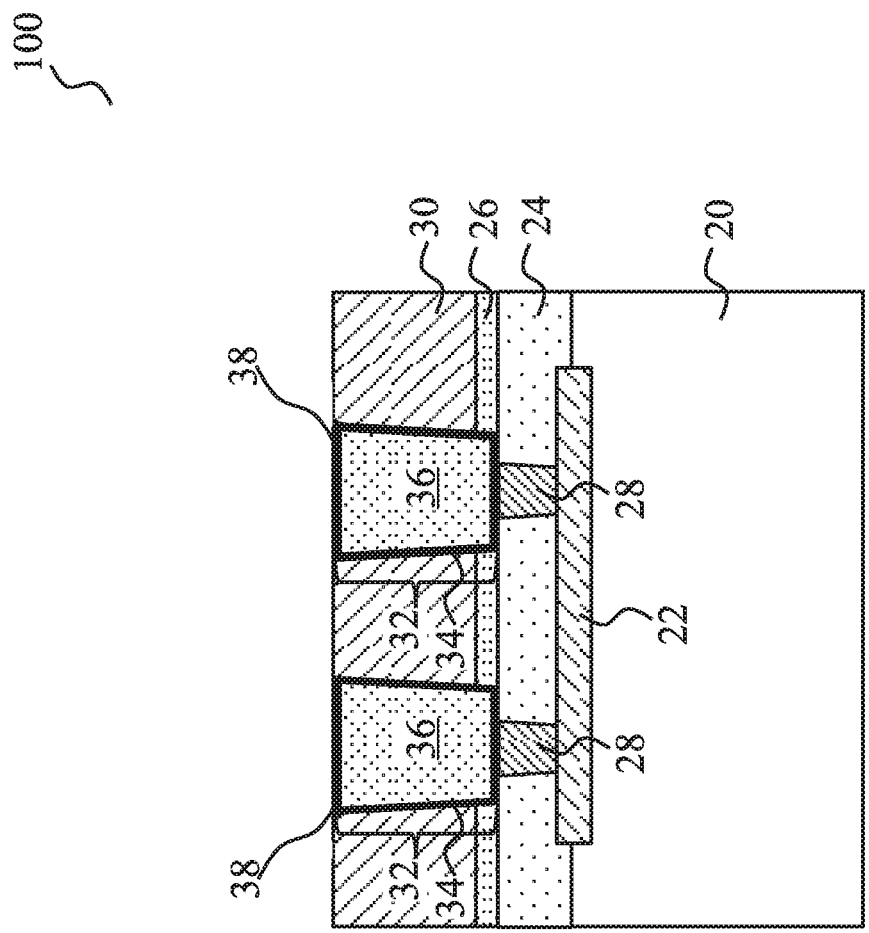

In accordance with some embodiments of the present disclosure, as shown in FIG. 3, metal capping layers 38 are formed over metal lines 32. The respective step is also shown as step 204 in process flow 200 shown in FIG. 15. In accordance with some embodiments of the present disclosure, metal capping layers 38 include cobalt (Co), tungsten (W), tantalum (Ta), nickel (Ni), molybdenum (Mo), manganese (Mn), titanium (Ti), iron (Fe), CoWP, CoB, or combinations thereof. Metal capping layers 38 may be formed selectively using electroless plating, during which wafer 100 is submerged in a plating solution. In alternative embodiments, metal capping layers 38 are blanket formed on metal lines 32 and IMD layer 30, for example, using Physical Vapor Deposition (PVD), followed by a photo lithography process to etch the undesirable portions.

Figure 4:
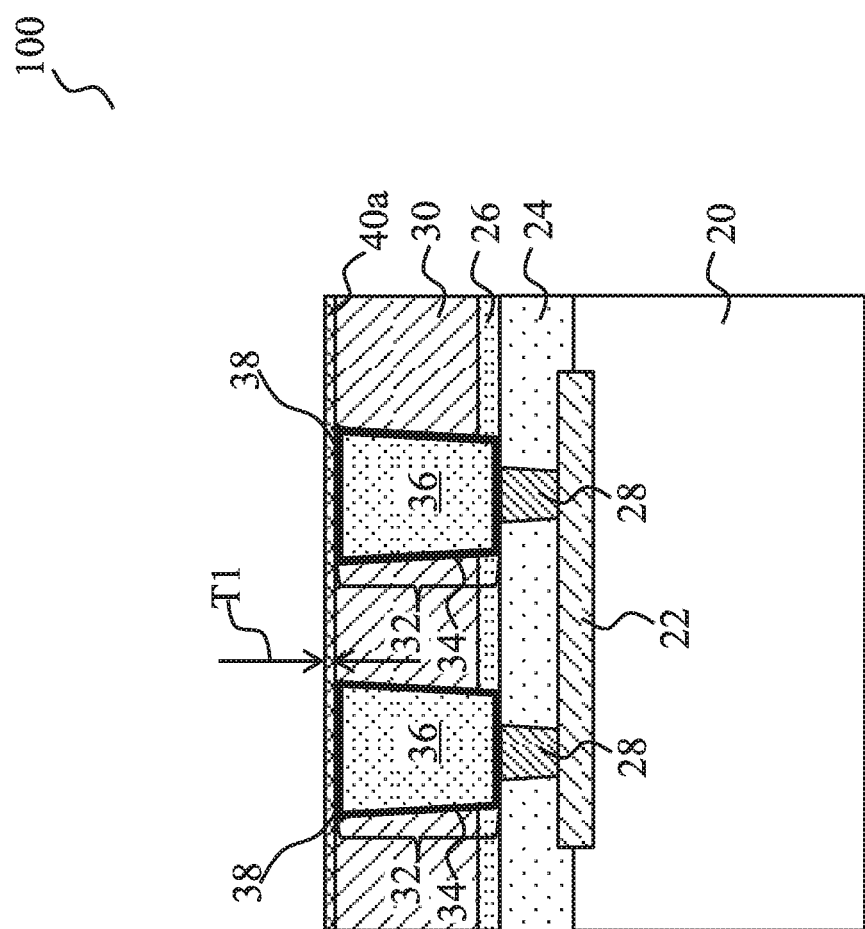
Figure 5:
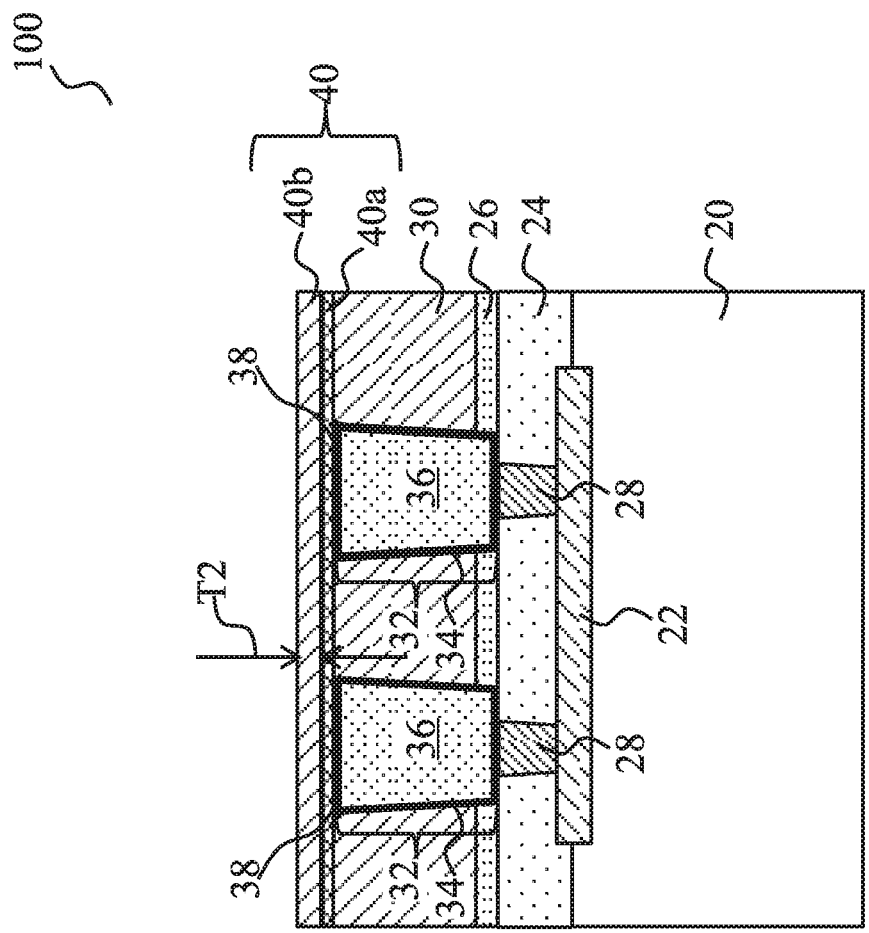

Next, as shown in FIGS. 4 through 6, etch stop layer 40 is formed. In accordance with some embodiments of the present disclosure, etch stop layer 40 includes two or more sub layers formed of metal compounds, with each of the sub layers alternatively referred to as an etch stop layer hereinafter.

Referring to FIG. 4, etch stop layer 40a (which is a sub layer of etch stop layer 40 as in FIG. 6) is formed. The respective step is also shown as step 206 in process flow 200 shown in FIG. 15. In accordance with some embodiments of the present disclosure, etch stop layer 40a includes a metal carbide. The metal in etch stop layer 40a may include Al, Cu, Mn, or combinations thereof. Accordingly, etch stop layer 40a may include aluminum carbide, copper carbide, manganese carbide, or combinations thereof. In some exemplary embodiments, etch stop layer 40a is free from nitrogen, or substantially free (for example, with an atomic percentage smaller than about one percent) from nitrogen. In alternative embodiments, etch stop layer 40a further comprises nitrogen, and hence may include a metal carbo-nitride. The nitrogen in the metal carbo-nitride may be low, for example, with an atomic percentage lower than about 10 percent or lower than about 5 percent. Furthermore, etch stop layer 40a is free from oxygen.

The formation methods of etch stop layer 40a include, and are not limited to, CVD and Atomic Layer Deposition (ALD). The thickness T1 of etch stop layer 40a is smaller than about 20 Å, and may be in the range between about 5 Å and 20 Å. The bottom surface of etch stop layer 40a is in contact with the top surfaces of IMD layer 30 and metal capping layers 38. Etch stop layer 40a has a good adhesion to IMD layer 30 and metal capping layers 38.

Next, as shown in FIG. 5, etch stop layer 40b (which is also a sub layer of etch stop layer 40 as in FIG. 6) is formed. The respective step is also shown as step 208 in process flow 200 shown in FIG. 15. In accordance with some embodiments of the present disclosure, etch stop layer 40b includes a metal nitride. The metal in etch stop layer 40b may include Al, Cu, Mn, or combinations thereof. Accordingly, etch stop layer 40b may include aluminum nitride, copper nitride, manganese nitride, or combinations thereof. The metal in etch stop layer 40b may be the same as the metal in etch stop layer 40a. Having a same metal in etch stop layers 40a and 40b may advantageously improve the adhesion between etch stop layers 40a and 40b, make the formation processes easier, and reduce the undesirable interaction between etch stop layers 40a and 40b. In accordance with alternative embodiments, the metal in etch stop layer 40b is different from the metal in etch stop layer 40a. The atomic percentages of the metal and nitrogen in etch stop layer 40b may be between about 20 percent and about 80 percent in accordance with some exemplary embodiments. For example, etch stop layer 40b may include $Al_2N_3$ in accordance with some exemplary embodiments.

Etch stop layer 40b, when deposited, may be free from carbon and oxygen, or substantially free from carbon and oxygen, for example, with an atomic percentage of each of the carbon and oxygen (if any) being lower than about 1 percent.

The formation methods for forming etch stop layer 40b include, and are not limited to, CVD and ALD. The thickness T2 of etch stop layer 40b is smaller than about 70 Å, and may be in the range between about 5 Å and 70 Å. The bottom surface of etch stop layer 40b may be in contact with etch stop layer 40a.

Next, as shown in FIG. 6, etch stop layer 40c is formed. The respective step is also shown as step 210 in process flow 200 shown in FIG. 15. In accordance with some embodiments of the present disclosure, etch stop layer 40c is formed by performing a treatment on etch stop layer 40b, so that a top surface layer of etch stop layer 40b is converted into etch stop layer 40c. The bottom portion of etch stop layer 40b, on the other hand, is not converted, and hence remains to be the metal nitride layer. The treatment may be performed using a carbon-containing process gas such as $CH_x$ (with x being an integer such as 1, 2, 4, or 4), $CO_2$, or the like. During the treatment, wafer 100 may be heated, for example, to a temperature in the range between about 200° C. and about 400° C. The treatment duration may be in the range between about 5 seconds and about 30 seconds. The treatment may be performed with plasma turned on. Alternatively, the treatment is performed without turning on plasma.

As a result of treating etch stop layer 40b in the carbon-containing process gas, etch stop layer 40c comprises a metal carbo-nitride. Depending on the metal in etch stop layer 40b, the metal carbo-nitride may be aluminum carbo-nitride, copper carbo-nitride, manganese carbo-nitride, or combinations thereof. In these embodiments, the metal in etch stop layer 40c is the same type of metal as in etch stop layer 40b. Also, the ratio of the atomic percentage of metal to the atomic percentage of nitrogen in etch stop layer 40a is equal to that of 40b. The thickness T3 of etch stop layer 40c may be smaller than about 20 Å, and may be between about 5 Å and about 20 Å in accordance with some embodiments. Furthermore, since the top layer of etch stop layer 40b is converted into etch stop layer 40c, the thickness of etch stop layer 40b is reduced from T2 (FIG. 5) to T4. Thickness T4 may be in the range between about 5 Å and about 50 Å. Furthermore, experiment results indicate that when the thickness of metal nitride layer 40b is about 10 Å or slightly lower (as low as about 5 Å), it can still reliably act as an etch stop layer stopping the etching of the overlying low-k dielectric layer. Accordingly, thickness T4 may be between about 5 Å and about 20 Å (and may be smaller than about 10 Å), so that it can perform the function of stop etching, while its thickness is still small enough not to cause significant parasitic capacitance in the resulting interconnect structure.

In accordance with alternative embodiments of the present disclosure, etch stop layer 40c is formed through deposition, for example, using CVD or ALD. Accordingly, etch stop layer 40c may comprise a metal carbide, and may be free from nitrogen, or substantially free from nitrogen (for example, with the nitrogen having an atomic parentage smaller than about 1 percent). Alternatively, etch stop layer 40c may also be deposited as a metal carbo-nitride. In these embodiments, the metal in etch stop layer 40c may be the same as, or different from, the metal in etch stop layer 40b, and thickness T4 may be smaller than about 50 Å, smaller than about 10 Å, or between about 5 Å and about 20 Å.

In accordance with alternative embodiments of the present disclosure, etch stop layer 40c is formed by performing a treatment on etch stop layer 40b using an oxygen-containing process gas such as $O_2$. During the treatment, wafer 100 may be heated, for example, to a temperature in the range between about 200° C. and about 400° C. The treatment duration may be in the range between about 5 seconds and about 60 seconds. The treatment may be performed with plasma turned on. Alternatively, the treatment is performed without turning on plasma.

As a result of treating etch stop layer 40b in the oxygen-containing process gas, the resulting etch stop layer 40c comprises a metal oxynitride. Depending on the metal in etch stop layer 40b, the metal oxynitride may be aluminum oxynitride, copper oxynitride, manganese oxynitride, or combinations thereof. In these embodiments, the metal in etch stop layer 40c is the same metal as in etch stop layer 40b. It is noted that the metal oxynitride is not used for forming etch stop layer 40a since the oxygen in the metal oxynitride may degrade the ability of metal capping layer 38 for preventing electro-migration. During the treatment using the oxygen-containing process gas, the bottom layer of etch stop layer 40b is not converted to metal oxynitride, and remains to be a metal nitride layer. In these embodiments, the thickness T1, T3, and T4 may be similar to the embodiments in which etch stop layer 40c comprises carbon rather than oxygen.

Throughout the description, etch stop layers 40a, 40b, and 40c are in combination referred to as etch stop layer 40. The etch stop layer 40b (after the formation of etch stop layer 40c) may be free from carbon and oxygen, or substantially free from carbon and oxygen. For example, an atomic percentage of each of the carbon and oxygen (if any) is lower than about 1 percent. In addition, etch stop layer 40b has a composition different from the composition of each of etch stop layers 40a and 40c, wherein either etch stop layer 40b includes elements different from the elements of etch stop layers 40a and 40c, and/or the atomic percentages of the elements in etch stop layer 40b are different from the atomic percentages of the corresponding elements in etch stop layers 40a and 40c.

Figure 7:
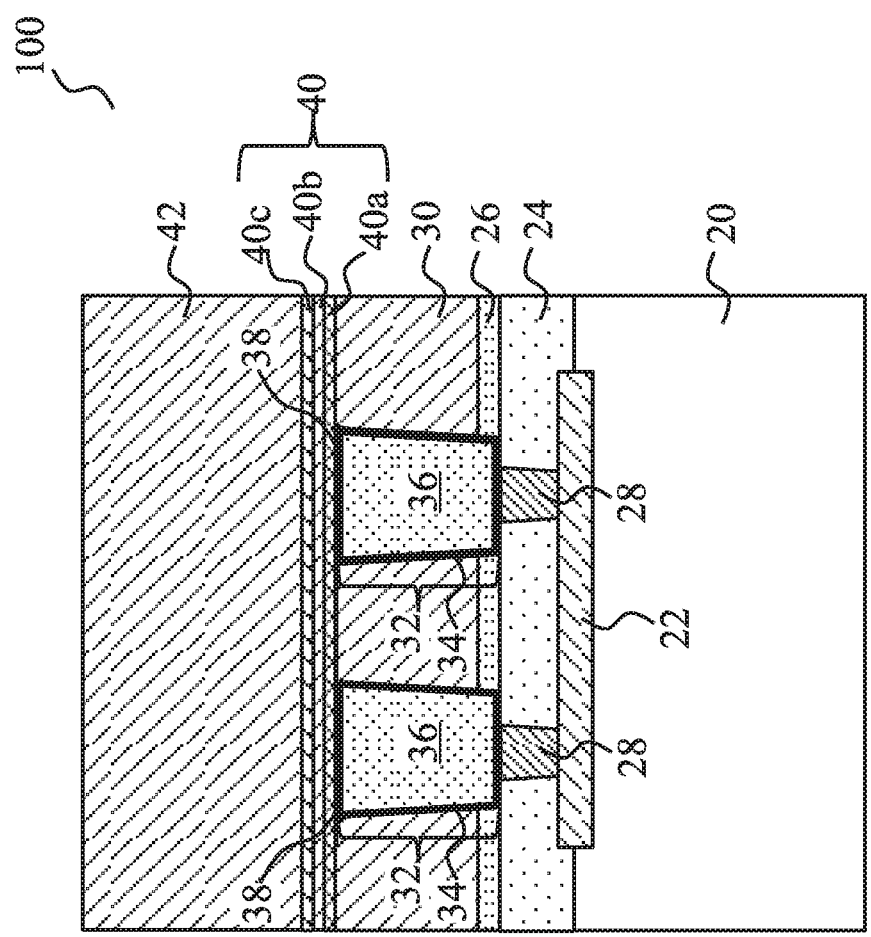

Referring to FIG. 7, IMD layer 42 is formed over etch stop layer 40. The respective step is also shown as step 212 in process flow 200 shown in FIG. 15. In accordance with some embodiments, IMD layer 42 is formed of a material that is selected from the same candidate materials for forming IMD layer 30. For example, IMD layer 42 may be formed of a carbon-containing dielectric material, Black Diamond, HSQ, MSQ, or the like. IMD layer 42 may also have a low-k value, which may be lower than about 3.0, 2.5, or 2.0. In accordance with some embodiments of the present disclosure, the formation of IMD layer 42 includes depositing a porogen-containing dielectric material and then performing a curing process to drive out the porogen, and hence the remaining IMD layer 42 is porous.

Figure 8:
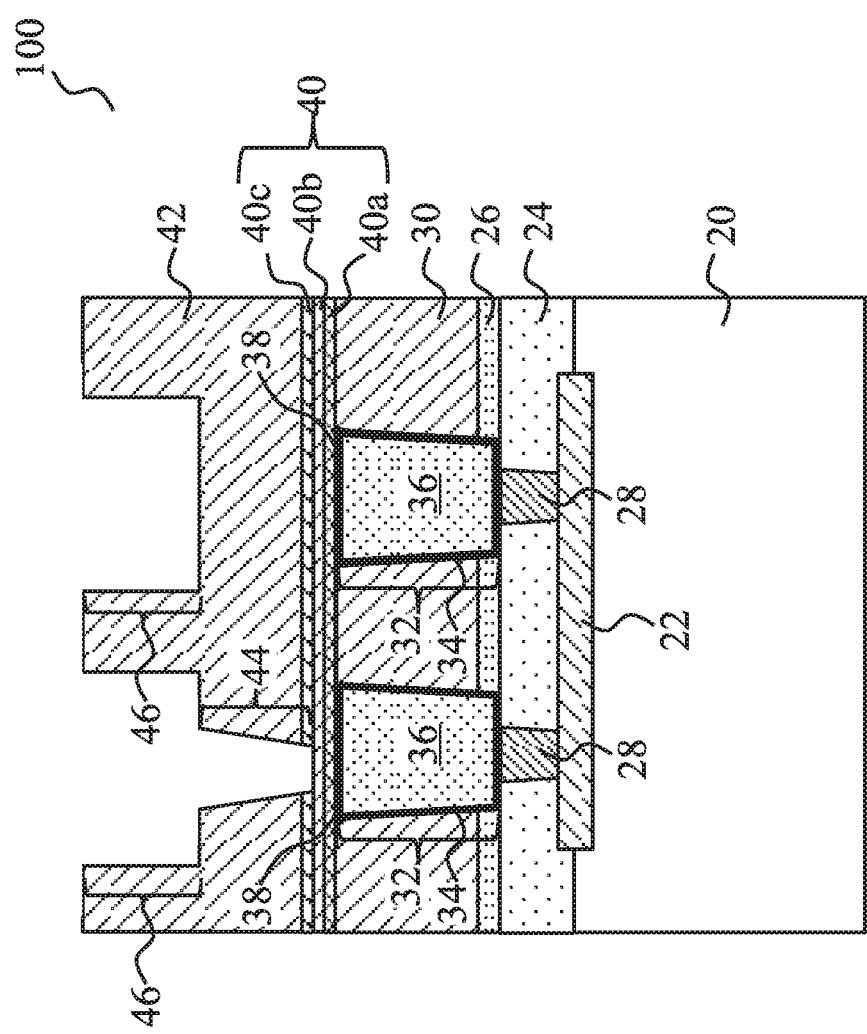

Referring to FIG. 8, trenches 46 and via opening 44 are formed in IMD layer 42. The respective step is also shown as step 214 in process flow 200 shown in FIG. 15. In accordance with some embodiments of the present disclosure, the formation processes includes performing a photo lithography process to etch IMD layer 42 in order to form initial via openings, wherein the initial via openings extend from the top surface of IMD layer 42 to an intermediate level between the top surface and the bottom surface of IMD layer 42. Next, a metal hard mask (not shown) is formed and patterned to define the patterns of trenches 46. An anisotropic etching is then performed to etch IMD layer 42 to form trenches 46. At the same time trenches 46 are formed, the via openings extend down to etch stop layer 40, forming via opening 44 as illustrated in FIG. 8. The etching step for forming trenches 46 may be performed using a time-mode, and may be stopped after the etching has been performed for a pre-set period of time. Other etch and stop point detection techniques, however, are also contemplated. In alternative embodiments, via opening 44 and trenches 46 are formed in separate photo lithography processes. For example, in a first photo lithography process, via opening 44 are formed to extend all the way down to etch stop layer 40. In a second lithography process, trenches 46 are formed to extend to an intermediate level of IMD 42. Etch stop layer 40 is then etched to expose the underlying metal capping layers 38.

In accordance with some embodiments of the present disclosure, the etching of IMD layer 42 is performed using a process gas comprising fluorine and carbon, wherein fluorine is used for etching, while carbon forms a polymer protecting the sidewalls of the resulting via opening 44 and trenches 46. With an appropriate fluorine-to-carbon ratio, via opening 44 and trenches 46 may have desirable profiles. For example, the process gases for the etching include a fluorine and carbon containing gas(es) such as $C_4F_8$ and/or $CF_4$ and a carrier gas such as $N_2$. In alternative embodiments, the process gases for the etching include $CH_2F_2$ and a carrier gas such as $N_2$.

The etching is performed using etch stop layer 40 to stop the etching. In accordance with some embodiments, via opening 44 penetrates through etch stop layer 40c and stops on etch stop layer 40b. The metal nitride in etch stop layer 40 is good at stopping the etching of IMD layer 42. Accordingly, although etch stop layer 40b is very thin, sometimes several angstroms to tens of angstroms thick, it may still effectively stop the etching.

Figure 9:
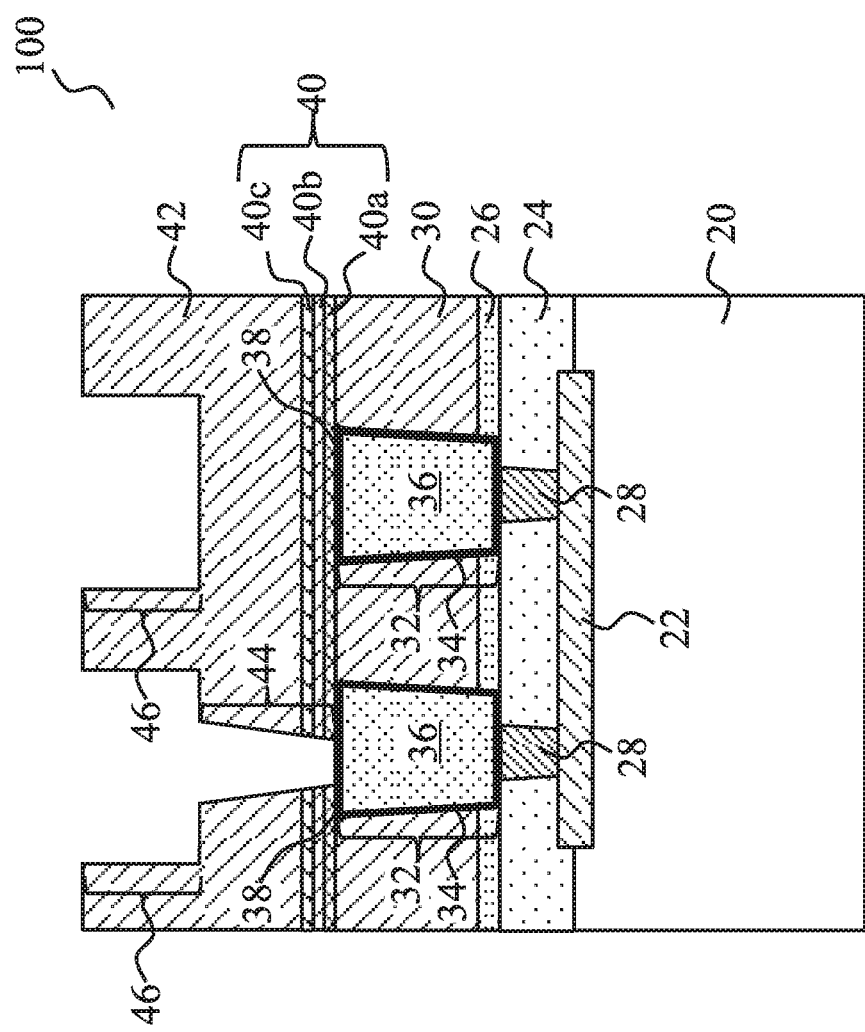

FIG. 9 illustrates the etching of etch stop layers 40b and 40a. After the etching of IMD layer 42, the process gas is changed to the process gas for etching through etch stop layer 40b and etch stop layer 40a, so that metal capping layer 38 is exposed to the resulting via opening 44.

Figure 10:
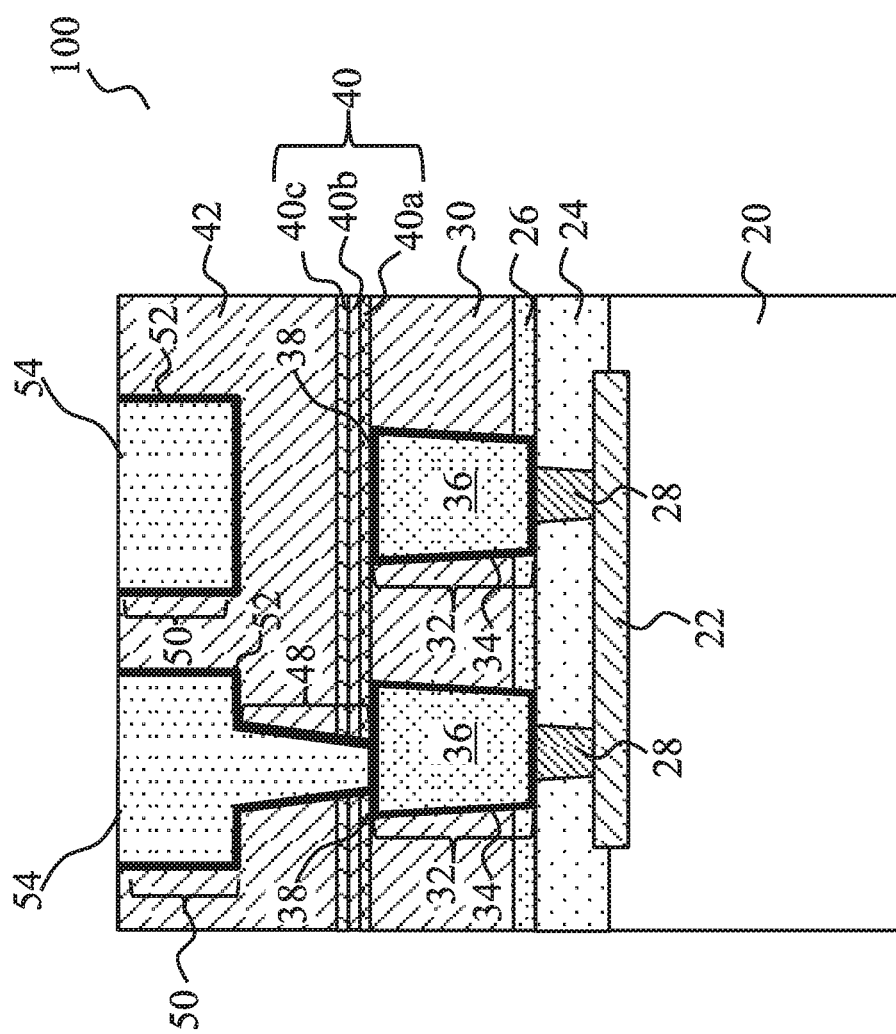

FIG. 10 illustrates the formation of conductive via 48 in via opening 44 (FIG. 9), and conductive lines 50 in trenches 46. The respective step is also shown as step 216 in process flow 200 shown in FIG. 15. Via 48 and conductive lines 50 may include liners 52, such as diffusion barrier layers, adhesion layers, or the like. Liners 52 may include titanium, titanium nitride, tantalum, tantalum nitride, or other alternatives. The inner material of conductive lines 50 over liners 52 is a conductive material such as copper, a copper alloy, nickel, gold, tungsten, aluminum, or the like. In some embodiments, the formation of via 48 and conductive lines 50 includes performing a blanket deposition to form liner 52, depositing a thin seed layer of copper or copper alloy, and filling the rest of via opening 44 and trenches 46 through, for example, electro-plating, electro-less plating, deposition, or the like. A CMP is performed to level the surface of conductive lines 50 and/or liners 52, and to remove excess material from the surface of IMD layer 42.

Figure 11:
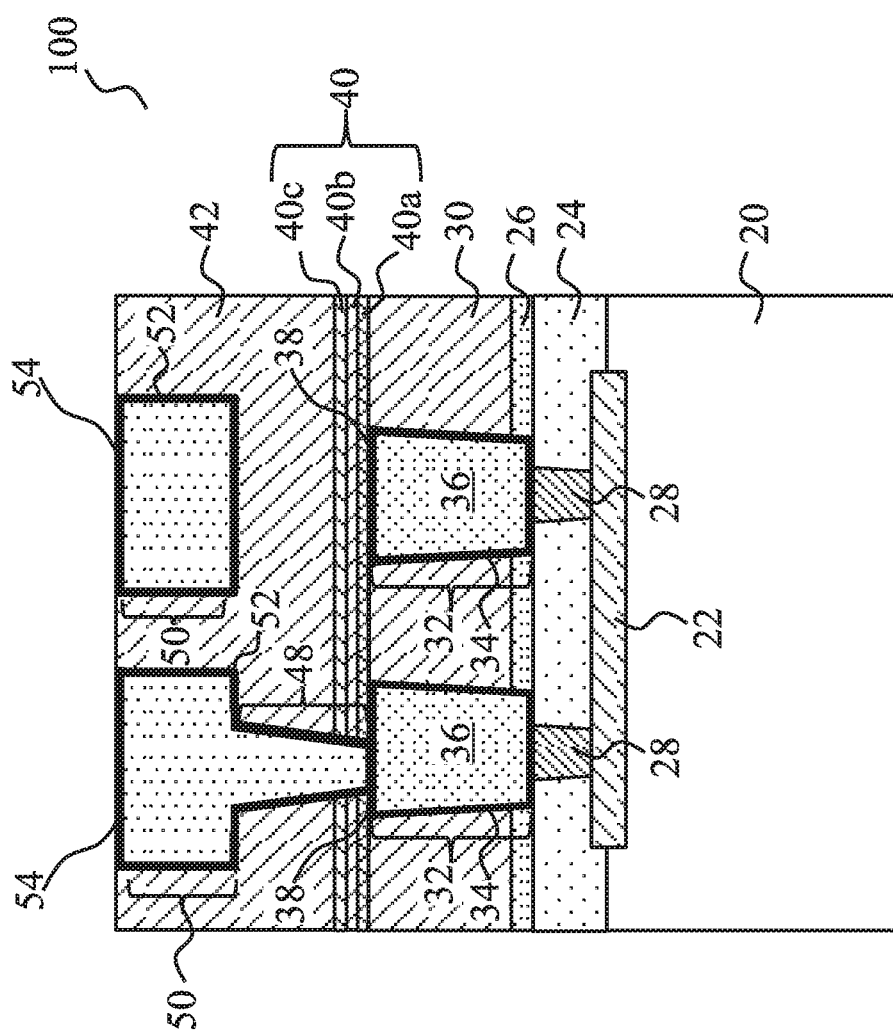

FIG. 11 illustrates the formation of metal capping layers 54 over conductive lines 50. Metal capping layers 54 may be formed of a material selected from the same group of candidate materials for forming metal capping layer 38. Furthermore, Metal capping layers 54 may be formed using the same method for forming Metal capping layers 38.

Figure 12:
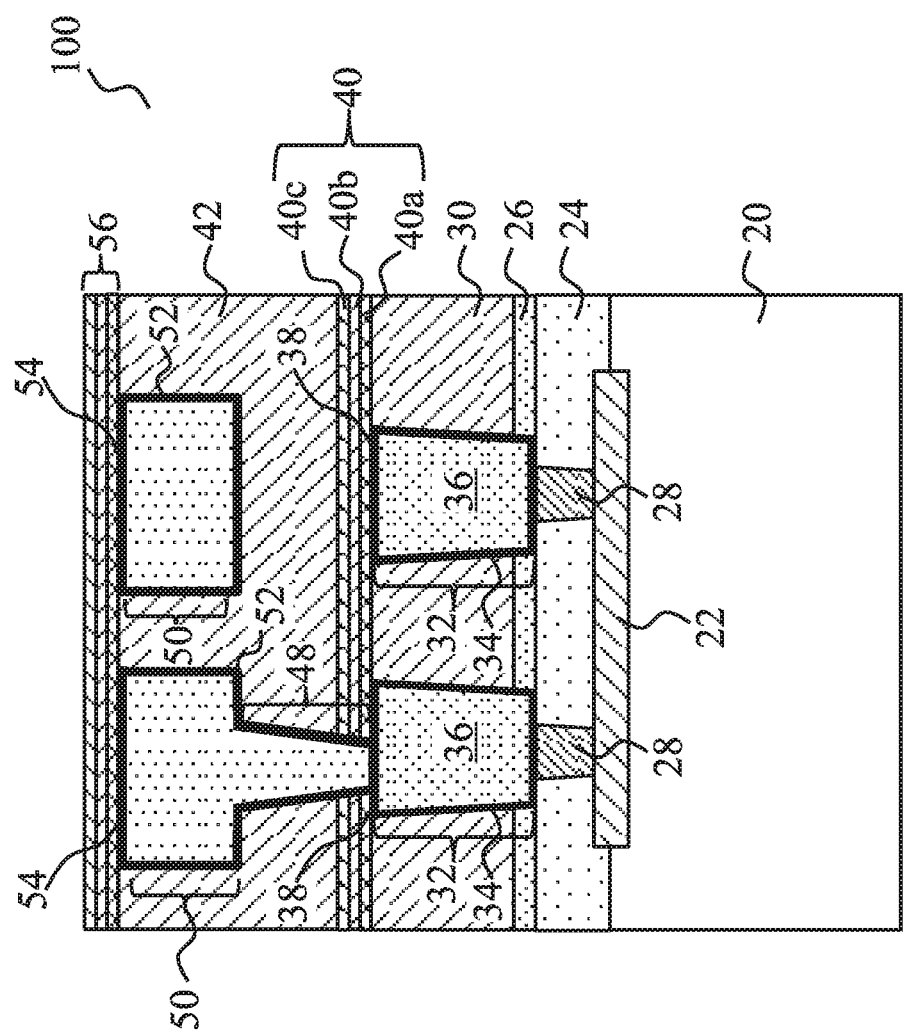

In a subsequent step, as shown in FIG. 12, etch stop layer 56 is formed over metal capping layers 54 and IMD layer 42. The structure, the materials, and the formation methods of etch stop layer 56 are similar to that of etch stop layer 40, and hence are not repeated herein. Process may then be continued to form more features such as IMD layers, metal lines, vias, and the like, or the structure in FIG. 12.

FIGS. 13 and 14 illustrate wafers 100 including the interconnect structures in accordance with alternative embodiments. Unless specified otherwise, the materials and the formation methods of the components in these embodiments are essentially the same as the like components, which are denoted by like reference numerals in the embodiments shown in FIGS. 1 through 12. The details regarding the formation process and the materials of the components shown in FIGS. 13 and 14 may thus be found in the discussion of the embodiments shown in FIGS. 1 through 12.

The structure shown in FIG. 13 is similar to the structure shown in FIG. 11, except that etch stop layer 40c (FIG. 12) is not formed in these embodiments. Etch stop layers 40a and 40b are formed. Etch stop layer 40a is in contact with the underlying metal capping layers 38 and IMD layer 30. Etch stop layer 40b is in contact with the overlying IMD layer 42 and via 48.

The structure shown in FIG. 14 is also similar to the structure shown in FIG. 11, except that etch stop layer 40a (FIG. 12) is not formed in these embodiments. Etch stop layers 40b and 40c are formed. Etch stop layer 40b is in contact with the underlying metal capping layers 38 and IMD layer 30. Etch stop layer 40c is in contact with the overlying IMD layer 42 and via 48.

The embodiments of the present disclosure have some advantageous features. Some metal nitrides can be good etch stop layers that can effectively stop the etching of overlying IMD layers. Accordingly, when used as etch stop layers, these metal nitrides can be formed very thin without sacrificing its ability for stop etching. With the etch stop layers formed of metal nitrides being very thin, the parasitic capacitance caused by the etch stop layers can be significantly reduced. This is beneficial for small scale integrated circuits forming using 16 nm technology or under, in which the parasitic capacitance caused by etch stop layers cannot be ignored. Metal nitrides, however, may have poor adhesion to low-k dielectric materials, and hence may incur problems such as delamination when used as etch stop layers. By forming the metal carbo-nitride, metal nitride, or metal oxynitride overlying and/or underlying the metal nitride layer, the adhesion problem is solved since the metal carbo-nitride, metal nitride, or metal oxynitride have good adhesion to both metal nitride and low-k dielectric layer. The overall thickness of the multi-layer etch stop layer is still small, and hence the resulting parasitic capacitance is small.

As a comparison, the conventional etch stop layers formed of silicon nitride, silicon carbide, silicon carbonitride, and the like typically need thicknesses greater than 100 Å in order to effectively stop etching. The corresponding parasitic capacitance is thus high.

In accordance with some embodiments of the present disclosure, an integrated circuit structure includes a dielectric layer and an etch stop layer. The etch stop layer includes a first sub layer including a metal nitride over the first dielectric layer, and a second sub layer overlying or underlying the first sub layer. The second sub layer includes a metal compound comprising an element selected from carbon and oxygen, and is in contact with the first sub layer.

In accordance with alternative embodiments of the present disclosure, an integrated circuit structure includes a first low-k dielectric layer and an etch stop layer. The etch stop layer includes a first sub layer comprising a metal carbide, a second sub layer over the first sub layer, wherein the second sub layer comprises a metal nitride, and a third sub layer overlying the second sub layer, wherein the third sub layer comprises a metal compound comprising an element selected from carbon and oxygen. A second low-k dielectric layer is over the etch stop layer. A via includes a portion in the second low-k dielectric layer, wherein the via penetrates through the etch stop layer.

In accordance with yet alternative embodiments of the present disclosure, a method includes forming an etch stop layer over a first dielectric layer, which includes forming a metal nitride layer over the first dielectric layer, and performing a treatment on the metal nitride layer using an oxygen-containing gas or a carbon-containing gas. A top surface layer of the metal nitride layer is converted to a second sub layer of the etch stop layer, and a bottom layer of the metal nitride layer remains untreated to act as a first sub layer of the etch stop layer. The method further includes forming a second dielectric layer over the etch stop layer, and etching the second dielectric layer, wherein the etching stops on the etch stop layer, and etching through the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first dielectric layer, wherein the forming the first dielectric layer comprises:
   depositing a metal carbide layer;
   depositing a metal nitride layer over the metal carbide layer; and
   performing a treatment on the metal nitride layer using a process gas selected from an oxygen-containing gas, a carbon-containing gas, and combinations thereof, wherein a top surface layer of the metal nitride layer is converted to a second sub layer, and a bottom layer of the metal nitride layer remains untreated to act as a first sub layer; and
   forming a second dielectric layer over the first dielectric layer.

2. The method of claim 1 further comprising:
   etching the second dielectric layer, with the first dielectric layer acting as an etch stop layer;
   etching-through the first dielectric layer; and
   forming a via extending into the second dielectric layer and the etch stop layer.

3. The method of claim 2, wherein the etching the second dielectric layer stops on the first sub layer.

4. The method of claim 1, wherein the treatment is performed using the process gas comprising the oxygen-containing gas.

5. The method of claim 4, wherein the oxygen-containing gas comprises carbon dioxide.

6. The method of claim 1, wherein the treatment is performed using the process gas comprising the carbon-containing gas.

7. The method of claim 6, wherein the carbon-containing gas comprises CHx.

8. The method of claim 1, wherein the metal carbide layer is formed using Atomic Layer Deposition (ALD) or Chemical Vapor Deposition (CVD).

9. The method of claim 1, wherein the metal nitride layer is free from carbon and oxygen.

10. A method comprising:
    forming a first dielectric layer comprising:
    depositing a first sub layer comprising a metal-and-carbon-containing compound;
    forming a second sub layer overlying and contacting the first sub layer, wherein the second sub layer comprises metal nitride, wherein the forming the second sub layer comprises depositing a metal nitride layer; and
    treating a top portion of the metal nitride layer using an oxygen-containing gas or a carbon-containing gas to form a third sub layer, with the third sub layer being a metal carbo-nitride layer or a metal oxynitride layer, wherein a bottom portion of the metal nitride layer remains not treated to act as the second sub layer; and
    depositing a second dielectric layer over the first dielectric layer.

11. The method of claim 10 further comprising:
    etching the second dielectric layer, with a portion of the first dielectric layer acting as an etch stop layer;
    etching-through the first dielectric layer; and
    forming a via extending into the second dielectric layer and the etch stop layer.

12. The method of claim 11, wherein the etching the second dielectric layer stops on the second sub layer, and the etching-through the first dielectric layer comprises etching-through the first sub layer and the second sub layer.

13. The method of claim 10, wherein the forming the second sub layer comprises depositing metal nitride.

14. The method of claim 10, wherein the treating is performed using the carbon-containing gas comprising carbon and hydrogen, and the third sub layer is the metal carbo-nitride layer.

15. The method of claim 10, wherein the treating is performed using the oxygen-containing gas, and the third sub layer is the metal oxynitride layer.

16. A method comprising:
    forming a first dielectric layer;
    forming a second dielectric layer over and contacting the first dielectric layer, the forming the second dielectric layer comprising:

depositing a carbon-and-metal-containing dielectric layer as a first sub layer, with the first sub layer contacting the first dielectric layer, wherein the first sub layer is free from oxygen;

depositing a metal nitride layer as a second sub layer, wherein the metal nitride layer is over and in physical contact with the first sub layer, and wherein the metal nitride layer is substantially free from oxygen and carbon;

forming a third sub layer over and in physical contact with the second sub layer, wherein the third sub layer comprises all elements in the second sub layer, and the third sub layer further comprises oxygen; and depositing a third dielectric layer over and in physical contact with the second dielectric layer.

17. The method of claim 16, wherein the third sub layer is formed by treating the metal nitride layer using an oxygen-containing gas.

18. The method of claim 17 further comprising:

etching the third dielectric layer, with the etching stopping on the second sub layer; and etching-through the second sub layer and the first sub layer.

19. The method of claim 10, wherein after the top portion of the metal nitride layer is treated, the metal nitride layer has a thickness smaller than about 10 Å.

20. The method of claim 16 further comprising forming a via in the third dielectric layer and the second dielectric layer.

* * * * *